United States Patent [19]

Shah

[11] Patent Number: 4,611,131

[45] Date of Patent: Sep. 9, 1986

[54] LOW POWER DECODER-DRIVER CIRCUIT

[75] Inventor: Ashwin H. Shah, Dallas, Tex.

[73] Assignee: Texas Instruments Incorporated, Dallas, Tex.

[21] Appl. No.: 528,372

[22] Filed: Aug. 31, 1983

[51] Int. Cl.⁴ .................. H03K 19/094; H03K 19/20; G11C 8/00

[52] U.S. Cl. .................... 307/449; 307/450; 307/270; 365/227; 365/230

[58] Field of Search .............. 307/449, 463, 481, 450, 307/270; 365/189, 226, 227, 230

[56] References Cited

U.S. PATENT DOCUMENTS

| 3,980,899 | 9/1976 | Shimada et al. | 307/449 X |
|---|---|---|---|
| 4,099,162 | 7/1978 | Basse | 307/463 X |
| 4,200,917 | 4/1980 | Moench | 307/449 X |
| 4,272,834 | 6/1981 | Noguchi et al. | 365/230 |
| 4,301,535 | 11/1981 | McKenny | 307/449 X |
| 4,393,472 | 7/1983 | Shimada et al. | 307/449 X |
| 4,401,903 | 8/1983 | Iizuka | 307/463 X |

FOREIGN PATENT DOCUMENTS 152930 1/1979 Japan .................. 307/463

Primary Examiner—Larry N. Anagnos
Attorney, Agent, or Firm—Robert Groover, III; Douglas A. Sorensen; Melvin Sharp

[57] ABSTRACT

A memory decoder wherein a power-up device is interposed between a NOR decoder and ground (VSS), rather than between the decoder and VDD. Preferably the signal to the power-up transistor is itself decoded, so that the power-consuming NOR circuits are inactive over a majority of the chip, even during power-up conditions.

8 Claims, 6 Drawing Figures

LOW-POWER DECODER/DRIVER CIRCUIT

PRIOR ART
CONVENTIONAL NOR DECODER

PRIOR ART
STATE-OF-THE-ART DECODER CIRCUIT

| AXP | $\overline{AXP}$ | AX ($\overline{AX}$) | NOR | AND |
|---|---|---|---|---|
| 1 | 0 | 0 | 1 | 1 |
| 1 | 0 | 1 | 0 | 0 |
| 0 | 1 | 0 | 1 | 0 |
| 0 | 1 | 1 | 1 | 0 |

Fig.3b

LOW POWER DECODER-DRIVER CIRCUIT

BACKGROUND AND SUMMARY OF THE INVENTION

The present invention relates to semiconductor memories and particularly to their address decoder circuits.

The conventional 1 of N decoder dissipates large amounts of power due to its NOR configuration. The state-of-the-art decoders as used in static random access memories use a power down technique where a low Vt enhancement device whose gate is controlled by the chip-select signal is used as a switch to VDD. This decoder design helps eliminate the decoder power dissipation during standby mode. However, during the active cycle the whole array of decoders is powered up by the chip-select signal and all but the selected decoder NOR circuit dissipate power. The disadvantage of the power-up transistor used as a switch to VDD is that the NOR output high level is degraded, due mainly to the Vt drop. FIG. 1 and FIG. 2 show the conventional NOR decoder and the state-of-the-art decoder respectively. Many different versions of the state-of-the-art decoder design are commercially used. One of them reduces power by reducing the number of decoders to half and switching each decoder for two outputs using an additional input bit.

The decoder circuit of the present invention differs from the conventional (and the state-of-the-art) circuits in that the proposed circuit uses a power up device to VSS and that the driver circuits of unselected decoders do not dissipate any power during an active cycle. The ANDing function of the NOR output and the power up signal is accomplished in the driver stage of this circuit. This driver stage employs a reliable push-pull output section.

Thus it is an object of the present invention to provide a decoder having minimal power consumption at no speed penalty.

It is a further object of the present invention to provide a semiconductor random access memory having minimal power consumption.

It is a further of object of the present invention to provide a semiconductor random access memory having minimal power consumption in ecoder circuits thereof.

According to the present invention there is provided:
a NOR circuit, said NOR circuit comprising a plurality of field effect transistors in parallel, each field effect transistor comprising a gate terminal and first and second source/drain terminals, all of said respective first source/drain terminals of said transistors in said NOR circuit being connected together, and all of said second source/drain terminals of said transistors in said NOR circuit being connected together, said gates of said NOR circuit transistors each being connected to a respective single address bit;
said first source-drain terminals of said NOR circuit transistors being operatively connected to receive a first power supply voltage;
said second terminals of said NOR circuit transistors being operatively connected through a power-up transistor to a second supply voltage, said second supply voltage being lower in voltage than said first supply voltage.

BRIEF DESCRIPTION OF THE DRAWINGS

The present invention will be described with reference to the accompanying drawings, which are hereby specifically incorporated by reference, wherein:

FIG. 3B shows a truth table for the circuit configuration shown in FIG. 3A;

DESCRIPTION OF THE PREFERRED EMBODIMENTS

Figure 1:
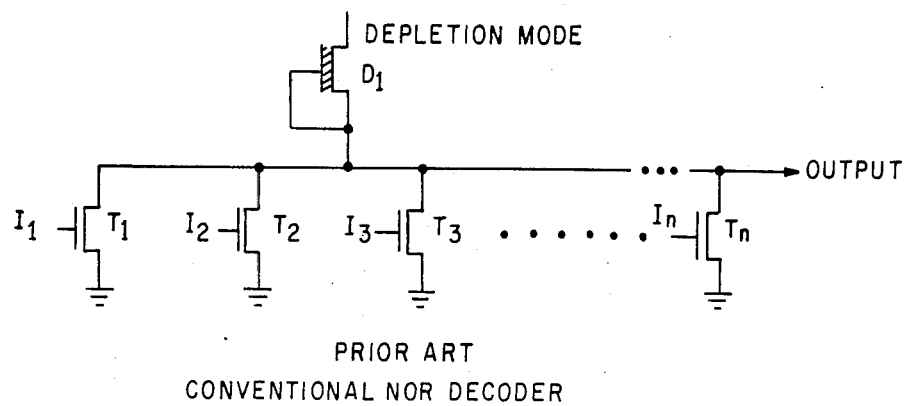
FIG. 1 shows a conventional NOR decoder.
Figure 2:
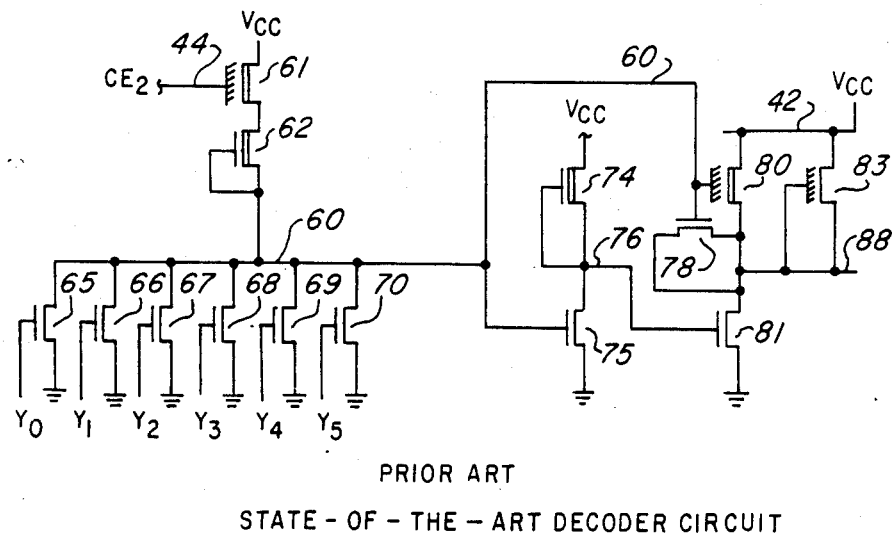
FIG. 2 shows a state-of-the-art prior art decoder circuit.
Figure 3A:
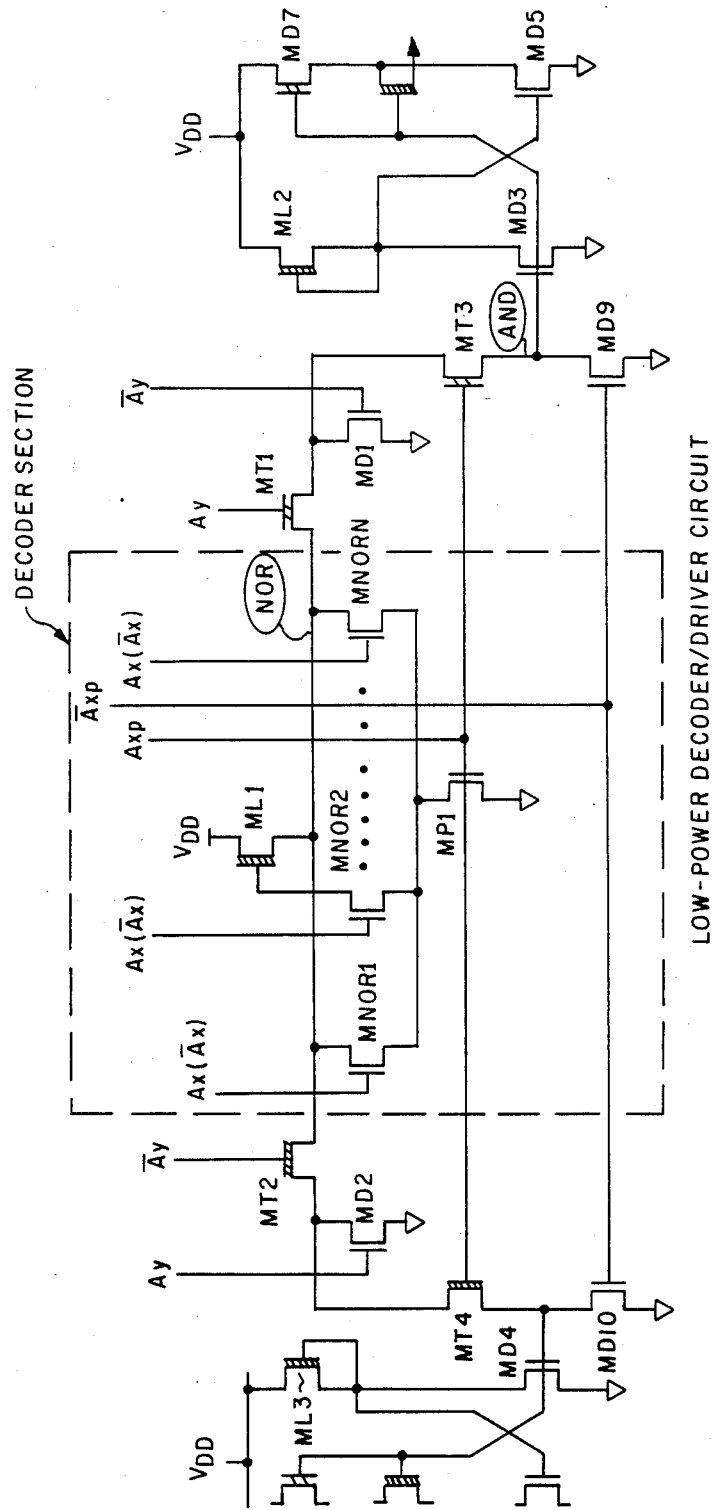
FIG. 3A shows a low-power decoder-driver circuit according to the present invention.

The decoder/driver circuit of the invention is shown in FIG. 3A. The decoder section consists of depletion mode device ML1, the NOR devices MNOR1 thru MNORN, and the power-up device MP1. The operation of the decoder section can be explained as follows. The logic level on the node labeled as NOR is basically a NOR of all the Ax(Ax̄) inputs when Axp is high. (That is, the particular address of the decoder shown will include some ones (the Ax bits) and some zeros (the Ax̄ bits).) Thus NOR will be high when either all the Ax(Ax̄) addresses are low and Axp is high, or when Axp is low. The state when Axp is low is defined as the power down state. Thus, the NOR logic level will be high either for a selected decoder or when the decoder is powered down. This condition is resolved further in the driver section to give a correct state on the node marked AND. That is, when this decoder section is powered down, power down device MD10 will be on, pulling down the gate of MD4, which will be off. The channel of ML3 will be coupled to pull-down driver MD6, so the output node will be pulled low.

The gate of MD4 will be high only when the decoder is power-up (i.e. Axp is high) and the address bits (Ax bits and Ax̄ bits) match the address of the NOR decoder. In this case, MD4 pulls down the gate of MD6, transistor MD8 sees a high level on its gate, and bootstrap device MB capacitatively couples a voltage increase into the source of MD8, so that MD8 turns on. This pulls the output node high.

The truth table of FIG. 3B shows all the possible logic levels on nodes NOR and AND. In the present invention, half of the decoder array is powered up by Axp and the other half is powered up by the complement of Axp, namely Ax̄p. The full decoder array size in this case is the binary combination of N+1 inputs, since there are N inputs to the NOR stage and since the power-up inputs Axp and Ax̄p are not assumed to be pre-decoded. In this case half of the decoder array will be powered down during an active cycle. This can be extended further such that only a small section of the decoder array is powered up. This can be accomplished by replacing the Ax̄p with a pre-decoded output and Axp by the pre-decoded signal's complement. This further reduction in decoder array power, however, requires another decoder which itself will dissipate some power and which will have to operate in serial fashion with the larger decoder array. Thus, there is a speed vs. power trade off to be considered in this application. The decoder array is fully powered down during the chip deselect mode since the Axp and Axp' are both held low during this mode.

The decoder/driver circuit shown in FIG. 3A shows two transfer gates MT1 and MT2. These are not necessary for the basic decoder/driver circuit, but they are very advantageously used in a static RAM where one memory subarray is on either said of the decoder array. In such a RAM, the NOR section can be shared by both halves of the memory array, and only the driver section has to be duplicated. The transfer gates MT1 and MT2 allow the decoder output to be steered to the proper half of the array. This reduces the power dissipation in the other half of the array, since it is not accessed.

Figure 5:
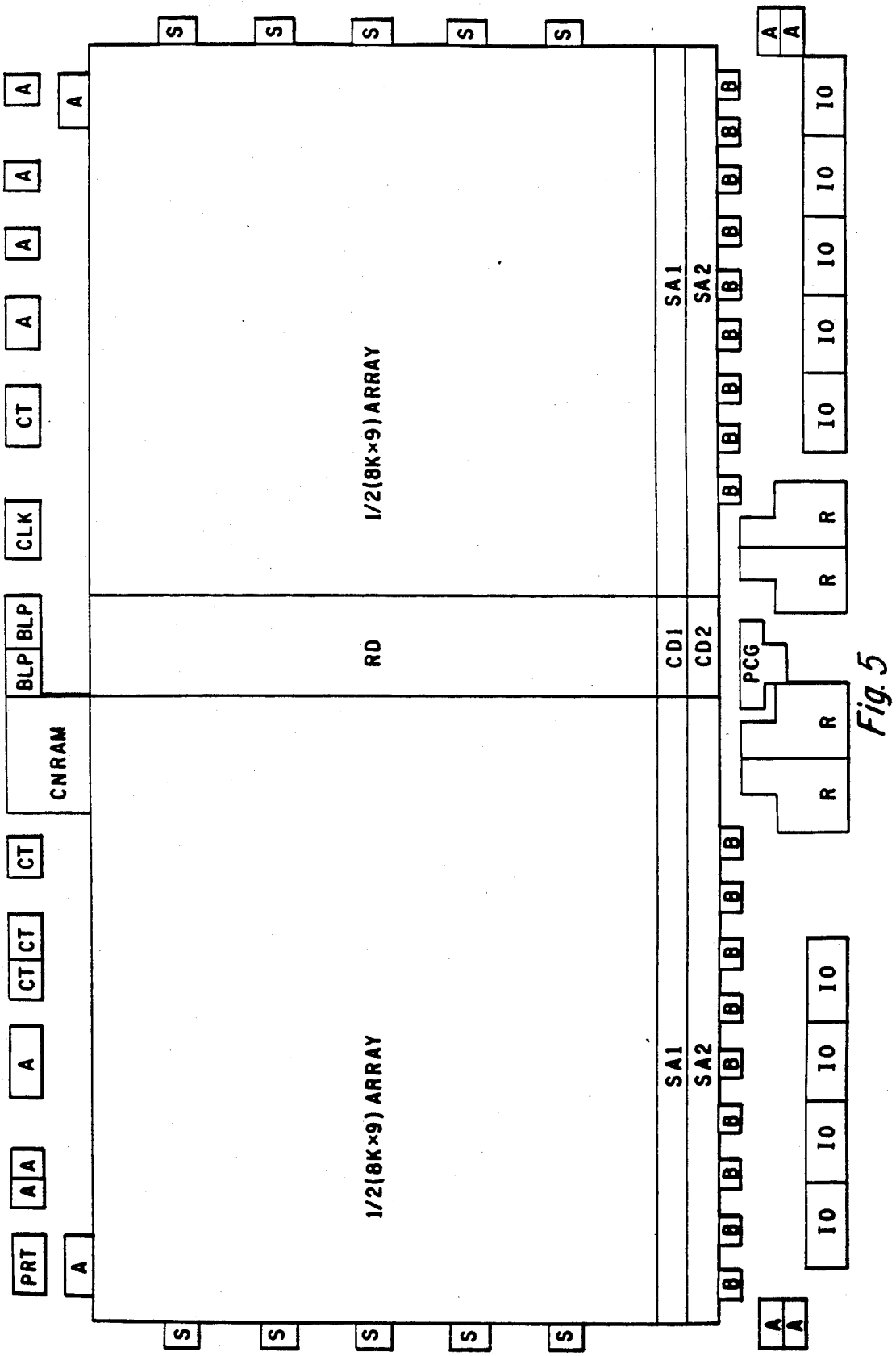
FIG. 5 shows a sample embodiment of the invention in a 8K×9 SRAM.

The present invention can be used for both row decoding and column decoding in SRAMs and/or DRAMs. However, the present invention is particularly advantageous for SRAMs, where power dissipation is a major problem. The presently preferred embodiment of the invention, in an 8K×9 SRAM, is shown in FIG. 5. Column decoders CD1 and CD2, and row decoders RD, are preferably configured according to the present invention.

The memory is split into two 4K by 9 half-arrays, each containing outputs at each of 9 bit positions. Each half-array preferably contains two redundant columns, each of which can be substituted for any defective column in half-array. One bit of the column address (Ay4) selects the right or left half-array, and the other four bits of column address are separately addressed in two stages: Column decoder CD1 decodes the least significant bits (Ay0 and Ay1) to provide four address lines. Each set of four primary sense amplifiers (corresponding to four columns) is connected to one secondary sense amplifier, either through a multiplex switch controlled by the four lines from decoder CD1, or (preferably) through a local buss driver by three-state drivers.

Decoder CD2 decodes the two next most significant bits (Ay2 and Ay3), to select the appropriate secondary sense amplifier SA2 for each bit position. The redundancy blocks each permit substitution of one of the two redundant columns for any defective column in the corresponding half-array, depending on the status of blown fuses. The partity generation and check logic PCG generates a ninth parity bit from an 8-bit input, and also performs a parity check on each 9-bit byte as read out from the array. The configuration RAM circuit CNRAM stores write protect information for 8 memory blocks (16 bits), and also stores bits indicating the selectable enablement of the parity check, address pipelining, and optional active pull up of the parity error output signals. (If active pull up is disabled, then multiple chips can be wire-ORed together, but external pull up resistors are required.)

The present invention has been described with reference to an NMOS embodiment, which is presently preferred and which is particularly advantageous with the present invention. That is, where the supply voltages are VDD=3 volts and ground, NMOS logic provides high speed decoding at adequately low power consumption. In the embodiment shown in FIG. 3A, the transistors having two diagonal lines in the drawing under their gates (i.e., transistors MD8, MT2, MT1, MT3, MT4, and MD7) are preferably natural-mode transistors, i.e. n-channel transistors having threshold voltage of about 0.2 volts. The transistors marked with multiple diagonal lines under their gates, i.e. transistors ML1 through ML3 and the bootstrap devices MB are preferably depletion-mode transistors, i.e., n-channel transistors having a threshold voltage in the neighborhood of −1.5 volts. The other transistors are preferably enhancement-mode transistors, i.e., transistors having a threshold voltage in the neighborhood of 0.5 volts. As will be appreciated by those skilled in the art, the threshold voltages of this embodiment can be widely modified and varied. The natural devices are preferably used where fast turn-on and/or a highly conductive on state is desired, even at the expense of a turn-off which is slightly slower and/or softer. However, these devices could be replaced by enhancement-mode devices. Similarly, if 5 volts is used for the VDD supply voltage, as is perhaps more conventional, slightly higher threshold voltages for the devices could be used.

More generally, while the present invention is preferably embodied in NMOS or mostly NMOS logic, even this is not necessary to the present invention. For example, the present invention could alternatively be embodied in the pseudo-CMOS form, by using p-channel devices for the load transistors ML. Similarly, the present invention could easily be embodied in PMOS logic, by reversing the polarities of all devices and of the supply voltages. The present invention could also be embodied in MESFET logic. In these alternative logic families, the teaching of the present invention is that a power-down device is interposed between a NOR decoder and the power supply voltage which corresponds to a deselect output of the decoder (i.e., to a "0" logic level). A further teaching of the invention is that this power-down device should be controlled by an additional address bit, which is not one of the address bits connected to the NOR decoder. An additional teaching of the present invention is that this additional address bit should also be connected to the output driver connected to the NOR decoder, so that the output of the output driver is held in the "zero" (i.e., deselect) state when the power-down transistor has deactivated the NOR gate.

Figure 4A:
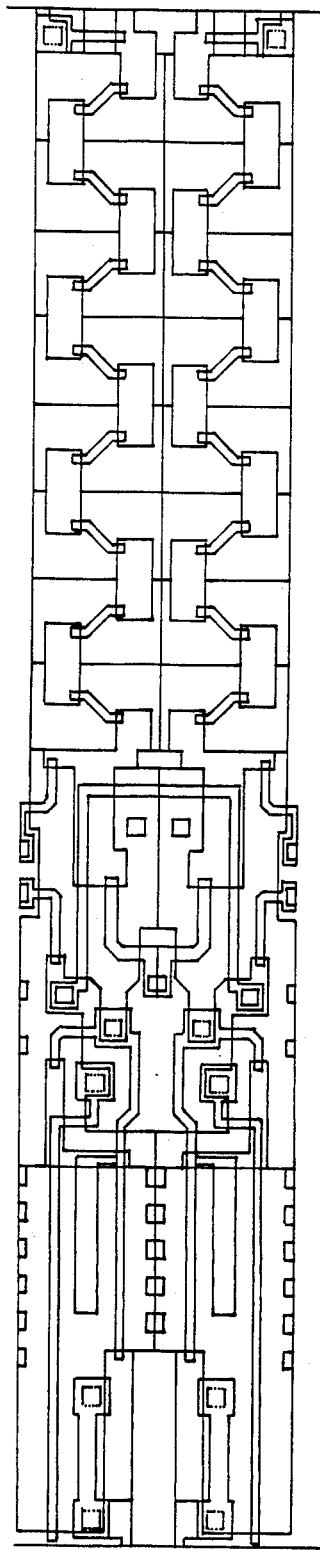
FIG. 4 shows a sample mask layout of the decoder of FIG. 3A.
Figure 4B:
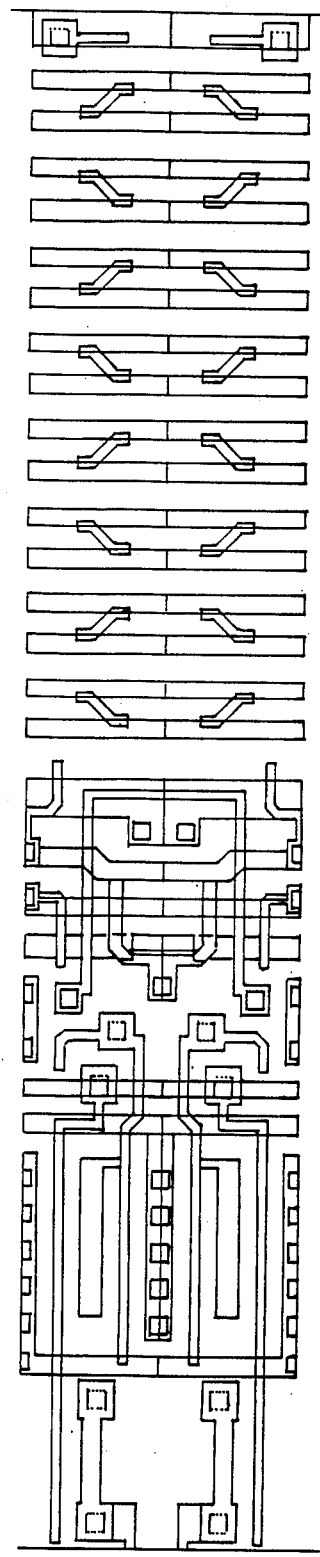

FIG. 4 shows a sample mask layout for implementation of the decoder circuit shown on FIG. 3A. As will be appreciated by those skilled in the art, this mask layout is not by any means necessary for practice of the present invention but is provided here merely as illustrative.

The present invention is specifically not limited to specific embodiments discussed above. A general teaching of the present invention is that a power-up transistor is interposed between a NOR selection circuit and ground (or the lower supply voltage), and other features of the invention can be very widely modified and varied. A further optional teaching of the present invention is that such a power-down NOR decoder is preferably combined with two driver sections, with one additional bit used to select one of the two driver sections. An alternative general teaching of the present invention is that a power-down NOR decoder, having a power-down device interposed between the NOR gate and ground, is combined with a driver section incorporating a power-down device such that the driver output goes low in the power-down mode. Thus, the scope of the present invention is expressly not limited except as set forth in the accompanying claims.

What is claimed is:

1. A decoder circuit comprising:
    (a) a NOR gate, said NOR gate comprising a plurality of transistors, each transistor having a pair of source/drain electrodes and a gate, said source and drain electrodes respectively being commonly connected, said gates of said transistors being connected to receive a combination of true and complemented address bits defining an address for said NOR gate, said NOR gate including output terminal means coupled to one of said commonly connected electrodes;

(b) a first voltage source;

(c) a load device connected to said output terminal means of said NOR gate and said first voltage source;

(d) a reference voltage source;

(e) power-up transistor means connected to the other of said commonly connected electrodes of said NOR gate and said reference source;

(f) said output terminal means of said NOR gate being operatively connected to provide "select" and "deselect" outputs in accordance with said signals applied to said address bits and said power-up transistor means, said first voltage source being closer to said "select" then to said "deselect" voltage, and said reference voltage source being closer to said "deselect" voltage than to said "select" voltage; and (g) driver circuit means having an output terminal, said driver circuit means being operatively connected to said output terminal means, said driver circuit means comprising power-down transistor means having a gate connected to a complement of the gate of said power-up transistor means, said power-down transistor means being connected to said output terminal means of said NOR gate and said output of said driver circuit.

2. The decoder of claim 1, wherein said power-up transistor means is connected to receive an additional address bit, said additional address bit not being inputted to any of said gates of said transistors in said NOR circuit.

3. A decoder circuit comprising:

(a) a NOR gate, said NOR gate comprising a plurality of transistors, each transistor having a pair of source/drain electrodes and a gate, said source and drain electrodes respectively being commonly connected, said gates of said transistors being connected to receive a combination of true and complemented address bits defining an address for said NOR gate, said NOR gate including output terminal means coupled to one of said commonly connected electrodes;

(b) a first voltage source;

(c) a load device connected to said output terminal means of said NOR gate and said first voltage source;

(d) a reference voltage source;

(e) power-up transistor means connected to the other of said commonly connected electrodes of said NOR gate and said reference voltage source;

(f) said output terminal means of said NOR gate being operatively connected to provide "select" and "deselect" outputs in accordance with said signals applied to said address bits and said power-up transistor means, said first voltage source being closer to said "select" than to said "deselect" voltage, and said reference voltage source being closer to said "deselect" voltage than to said "select" voltage; and (g) a pair of driver circuit means, each having output terminal means, said driver circuit means being operatively connected to said output terminal means, said driver circuit means comprising power-down transistor means having a gate connected to a complement of the gate of said power-up transistor means, said power-down transistor means being connected to said output terminal means of said NOR gate and said output of said driver circuit.

4. A decoder circuit comprising:

(a) a NOR gate, said NOR gate comprising a plurality of transistors, each transistor having a pair of source/drain electrodes and a gate, said source and drain electrodes respectively being commonly connected, said gates of said transistors being connected to receive a combination of true and complemented address bits defining an address for said NOR gate, said NOR gate including output terminal means coupled to one of said commonly connected electrodes;

(b) a first voltage source;

(c) a load device connected to said output terminal means of said NOR gate and said first voltage source; and (d) a reference voltage source;

(e) power-up transistor means connected to the other of said commonly connected electrodes of said NOR gate and said reference voltage source;

(f) said output terminal means of said NOR gate being operatively connected to provide "select" and "deselect" outputs in accordance with said signals applied to said address bits and said power-up transistor means, said first voltage source being closer to said "select" than to said "deselect" voltage, and said reference voltage source being closer to said "deselect" voltage than to said "select" voltage; and (g) said power-up transistor means comprising a gate connected to receive an additional address bit, said additional address bit not being inputted to any of said gates of said transistors of said NOR circuit;

(h) said output terminal means of said NOR circuit being connected to each of two driver circuits, each of said driver circuits comprising power-down transistor means connected to said output terminal means of said NOR circuit and one of the respective outputs of said driver;

(i) said output terminal means further comprising output steering transistor means connected to said output means of said NOR circuit and the output of the associated driver circuit, said output steering transistor means being controlled by mutually complementary output steering address bits, said complementary output steering address bits both not being inputted to any of said gates of said transistors in said NOR circuit or to said power-up means.

5. A static random access memory comprising:

(a) an array of memory cells arranged in rows and columns;

(b) a plurality of row address decoders and column address decoders, said decoders each being connected to receive a plurality of address bits and to provide a "select" signal of a particular decoded line in correspondence to a respective predetermined pattern of said address bits;

wherein at least one of said decoders comprises:

(c) a NOR gate, said NOR gate comprising a plurality of transistors, each transistor having a pair of source/drain electrodes and a gate, said source and drain electrodes respectively being commonly connected, said gates of said transistors being connected to receive a combination of true and complemented address bits defining an address for said NOR gate, said NOR gate including output terminal means coupled to one of said commonly connected electrodes;

(d) a first voltage source;

(e) a load device connected to said output terminal means of said NOR gate and said first voltage source;

(f) a reference voltage source;

(g) power-up transistor means connected to the other of said commonly connected electrodes of said NOR gate and said reference voltage source;

(h) said output terminal means of said NOR gate being operatively connected to provide "select" and "deselect" outputs in accordance with said signals applied to said address bits and said power-up transistor means, said first voltage source being closer to said "select" than to said "deselect" voltage, and said reference voltage source being closer to said "deselect" voltage than to said "select" voltage; and (i) driver circuit means having an output terminal, said driver circuit means being operatively connected to said output terminal means, said driver circuit means comprising power-down transistor means having a gate connected to a complement of the gate of said power-up transistor means, said power-down transistor means being connected to said output terminal means of said NOR gate and said output of said driver circuit.

6. A static random access memory as set forth in claim 5, wherein said driver circuit means comprises two driver circuit means each having output means, each of said driver circuit means comprising power-down transistor means connected to said output terminal means of said NOR circuit and one of the respective output means of said driver circuit; and said output terminal means further comprising output steering transistor means connected to said output means of said NOR circuit and the output of the associated driver circuit means, said output steering transistor means being controlled by mutually complementary output steering address bits, said complementary output steering address bits both not being inputted to any of said gates of said transistors in said NOR circuit or to said power-up means.

7. The memory of claim 6 wherein said power-up transistor means is connected to receive an additional address bit, said additional address bit not being inputted to any of said gates of said transistors of said NOR circuit.

8. The memory of claim 5 wherein said power-up transistor means is connected to receive an additional address bit, said additional address bit not being inputted to any of said gates of said transistors of said NOR circuit.

* * * * *